(12) United States Patent
Song

(10) Patent No.: US 7,304,538 B2
(45) Date of Patent: Dec. 4, 2007

(54) ACCURATE QUIESCENT CURRENT CONTROL SCHEME IN FLOATING CONTROLLED CLASS AB AMPLIFIER

(75) Inventor: Jungwoo Song, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/975,107

(22) Filed: Oct. 28, 2004

(65) Prior Publication Data

US 2005/0280468 A1 Dec. 22, 2005

Related U.S. Application Data

(60) Provisional application No. 60/580,905, filed on Jun. 21, 2004.

(51) Int. Cl.
*H03F 3/185* (2006.01)
(52) U.S. Cl. ........................ 330/264; 330/267
(58) Field of Classification Search ................ 330/264, 330/267, 255
See application file for complete search history.

(56) References Cited

U.S. PATENT DOCUMENTS

| | | | | |
|---|---|---|---|---|
| 5,311,145 | A * | 5/1994 | Huijsing et al. | 330/255 |
| 6,369,653 | B1 * | 4/2002 | Kappes | 330/267 |
| 6,583,669 | B1 * | 6/2003 | Eschauzier et al. | 330/255 |

* cited by examiner

*Primary Examiner*—Robert Pascal
*Assistant Examiner*—Alan Wong
(74) *Attorney, Agent, or Firm*—Sterne, Kessler, Goldstein & Fox PLLC

(57) ABSTRACT

Provided is an amplifier including a system for controlling output stage quiescent current. The amplifier includes a driving stage including first pmos and nmos transistors coupled together, and an output stage connected to the driving stage. The output stage includes second pmos and nmos transistors coupled together. The amplifier also includes a quiescent control stage connected to the driving stage and including third pmos and nmos transistors coupled together, fourth pmos coupled to third pmos and $4^{th}$ nmos coupled to $3^{rd}$ nmos. A topology of the coupled third pmos and nmos transistors substantially matches a topology of the coupled first pmos and nmos transistors, and $4^{th}$ pmos and nmos match to 2nd pmos and nmos.

7 Claims, 6 Drawing Sheets

ACCURATE QUIESCENT CURRENT CONTROL SCHEME IN FLOATING CONTROLLED CLASS AB AMPLIFIER

CROSS-REFERENCE TO RELATED APPLICATIONS

This application claims the benefit of U.S. Provisional Application No. 60/580,905, filed Jun. 21, 2004, which is incorporated herein by reference.

BACKGROUND OF THE INVENTION

1. Field of the Invention

The present invention relates to the field of amplifiers. In particular, the present invention is related to the of field quiescent current control in class AB (push-pull) amplifiers used in analog circuits.

2. Related Art

Class AB type amplifiers are widely used in analog circuits for their higher power efficiency, as compared, for example, to class A amplifiers. In class AB amplifiers, control of quiescent current in the amplifier's output stage is critical since it affects standby power and crossover distortion. Among various class AB amplifier architectures, the floating class conventional AB control amplifiers are commonly used for their simple quiescent current control scheme.

Quiescent current control schemes are generally designed to minimize the level and variation of this current within amplifiers in general, and class AB amplifiers in particular. If the quiescent current (Iq) is a high value, the Iq is easier to control and the amplifier's non-linearity performance is better. However, a high quiescent current (Iq) translates to greater power consumption in standby mode. On the other hand, a low quiescent current (Iq) value means the amplifier's non-linearity is high and the cross over distortion will also be high. If the quiescent current (Iq) is very small, the amplifier's accuracy will also be low, with high variations over its operational ranges.

A major shortcoming of these convention amplifier quiescent current control schemes is that Iq varies significantly with process, supply voltage and temperature variations. These variations are one of the features that make these traditional class AB amplifiers undesirable for low power applications.

What is needed, therefore, is a more robust technique to minimize variations in the quiescent current (Iq) flowing through the output stage of push pull amplifiers, such as the class AB amplifier.

BRIEF SUMMARY OF THE INVENTION

Consistent with the principles of the present invention as embodied and broadly described herein, an amplifier includes a driving stage having first pmos and nmos transistors coupled together and an output stage connected to the driving stage. The output stage includes second pmos and nmos transistors coupled together. The amplifier also includes a quiescent current control stage connected to the driving stage and includes third pmos and nmos transistors coupled together, fourth pmos coupled to third pmos and $4^{th}$ nmos coupled to $3^{rd}$ nmos. A topology of the coupled third pmos and nmos transistors substantially matches a topology of the coupled first pmos and nmos transistors, and $4^{th}$ pmos and nmos match to 2nd pmos and nmos.

Further embodiments, features, and advantages of the present invention, as well as the structure and operation of the various embodiments of the present invention are described in detail below with reference to the accompanying drawings.

BRIEF DESCRIPTION OF THE DRAWINGS/FIGURES

The accompanying drawings, which are incorporated in and constitute part of the specification, illustrate embodiments of the present invention and, together with the general description given above and the detailed description of the embodiments given below, serve to explain the principles of the invention. In the drawings.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

It would be apparent to one of skill in the art that the present invention, as described below, may be implemented in many different embodiments of software, hardware, firmware, and/or the entities illustrated in the figures. Any actual software code with the specialized control of hardware to implement the present invention is not limiting of the present invention. Thus, the operational behavior of the present invention will be described with the understanding that modifications and variations of the embodiments are possible, given the level of detail presented herein.

Figure 1:
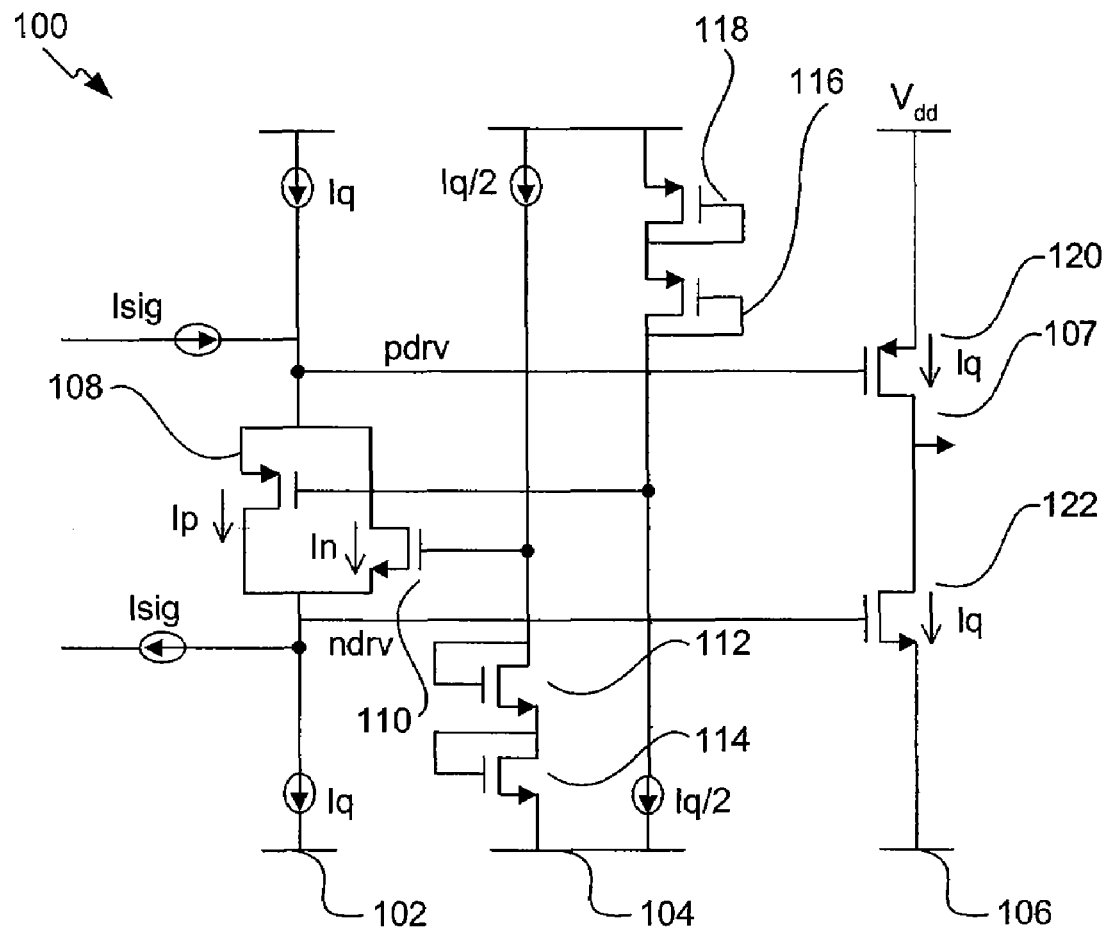
FIG. 1 is a schematic diagram of a conventional circuit structured to control quiescent current.

In FIG. 1, a conventional quiescent current amplifier control circuit 100 includes a class AB amplifier driving stage 102, an Iq control stage 104, and an output stage 106. Amplifier control circuits, such as the amplifier control circuit 100, are commonly used in class AB amplifiers. A consistent challenge of class AB amplifier Iq control circuits, however, is that the quiescent current (Iq) control scheme is largely inadequate. In extreme cases, for example, Iq can vary up to about 26%.

Nonetheless, the conventional quiescent control circuit 100 provides a measure of Iq control by reducing Iq variations in the output stage 106. The Iq of the output stage 106 is controlled by using matching transistors in the driving stage 102, the Iq control stage 104, and the output stage 106.

Iq is also known as the offload current and is provided by current sources shown in FIG. 1. Iq in FIG. 1 is roughly equal to the amount of current used by the circuit 100 when there is no load connected. When Iq is inaccurate or largely varying, the amplifier's bandwidth can be affected with such variations. Process variations in the amplifier's manufacturing may contribute to the Iq inaccuracies and decrease device yields.

In FIG. 1, an input current signal Isig, such as an audio signal from a stereo speaker, is provided as an input to the driving stage 102. When the signal Isig is provided as an input to the driving stage 102, Isig will also be reflected in an output 107 of the output stage 106. Thus, if the value of the current signal Isig is zero, then the current produced at the output 107 should also be zero. Consequently, the only power consumption is the current Iq from the sources of the driving stage 102 and the output stage 106.

The driving stage 102 includes a p-channel metal oxide semiconductor (pmos) transistor 108 connected to an n-channel metal oxide semiconductor (nmos) transistor 110. As shown in FIG. 1, when Isig is provided as an input, a current Ip flows through the pmos transistor 108 and a current In flows through the nmos transistor 110. The Voltages and the impedances at the node pdrv and ndrv are set by Ip and In respectively. Furthermore, as long as the current sources (I) are matched, the output quiescent current (Iq) is only dependent on the matching between the transistors. However, the circuit 100 can only control the sum of Ip+In and cannot control the currents Ip and In individually.

By way of additional background, there is a crossover point (zero crossing) from when the current signal through the amplifier's driving stage (e.g., the class AB driving stage 102) transitions from positive (p) to negative (n). The change of amplifier properties such as gain of gm's (transconductances) output stage while crossing the zero point affects the cross over distortion performance of the amplifier.

As noted above, the quiescent current (Iq) of the output stage 106 is controlled by using matching transistors in the driving stage 102, the Iq control stage 104, and the output stage 106. In FIG. 1, for example, the pmos transistor 108 of the driving stage 102 is the same type (copy) as the pmos transistor 116 of the Iq control stage 104. In this manner, current flowing through the transistor 116 will directly reflect the current flowing through the transistor 108 in standby state. Additionally, the pmos transistor 118 of the Iq control stage is the same type transistor as the pmos transistor 120 of the output stage 106. Consequently, current flowing through the transistor 118 is supposed to directly reflect current flowing through the transistor 120 in standby state.

Similarly, the nmos transistor 110 of the driving stage 102 is the same type (copy) transistor as the nmos transistor 112 of the Iq control stage 104. The nmos transistor 114 of the Iq control stage 104 is the same type as the nmos transistor 122 of the output stage 106. Transistor matching, in combination with the use of current sources Iq in the driving stage 102 and current sources Iq/2 in the Iq control stage 104, enables the transistors 108 and 110 to reduce variations in Iq in the output stage 106. The goal of the technique of the conventional circuit 100 of FIG. 1 is to try and maintain the current through the transistors 120 and 122 at the value Iq.

In reality, however, the effectiveness of the technique of the control circuit 100 to maintain a substantially constant value of Iq in the output stage 106, is only marginal at best. One reason for this marginal effectiveness is that although there is matching between operational characteristics of the transistors, the transistor topologies do not match.

The inventor of the present application has discovered that by also matching the topologies of the transistors of the driving stage 102, the Iq control stage 104, and the output stage 106, variations in the quiescent current (Iq) can be further reduced. More precisely, topology matching further improves Iq control over process, temperature, and supply voltage variations.

One additional factor that influences the accuracy with which Iq can be controlled in the output stage is the degree to which the current Iq and In can be individually controlled. Individual control of the currents Ip and In is important for the performance of the Iq control circuits, such as the circuit 100. Individual control is important because the impedances of the nodes pdrv and ndrv are individually affected by transconductance (gm) values of the transistors 108 and 110.

Figure 2:
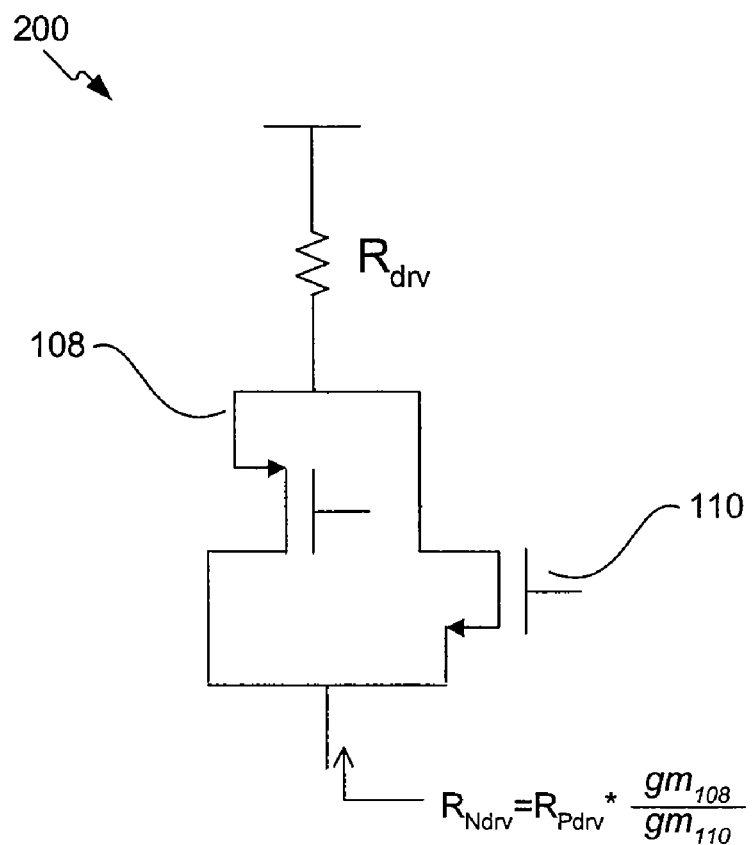
FIG. 2 is a schematic to illustrate the effect of values of MP and MN transistors on an the impedance of a node ndrv in a driving stage of the conventional quiescent current control circuit of FIG. 1.

FIG. 2 is a schematic diagram illustration highlighting control of the impedance of the nodes pdrv and ndrv. FIG. 2 also provides an illustration of the relationship of the impedance control to the gm of the transistors 108 and 110. In FIG. 2, if Ip and In can each be carefully controlled individually such that Ip substantially equals In, then both pdrv and ndrv become high impedance nodes. To create the condition where Ip substantially equals In, the transconductance of the transistor 108 ($gm_{108}$) should be roughly equal to the transconductance of the transistor 110 ($gm_{110}$), as shown in FIG. 2. Thus, under these optimal conditions, where Ip and In can be individually controlled, this control provides that $R_{ndrv}=R_{pdrv}$ and enables both nodes to be high impedance.

If Ip and In are not individually controlled, either of pdrv or ndrv can be set to low impedance state. In such condition, when the current value of a signal provided at the output 107 of the output stage 106 is crossing the zero-cross point (discussed above), a driving impedance of the node pdrv or ndrv changes abruptly from low to high or vice versa, making the crossover distortion worse. Also, because the low impedance node cannot swing from rail to rail due to its low impedance, the current drivability of output transistor 120 or 122 which is driven by low impedance is very limited, resulting in a reduced maximum available sourcing or sinking current of the amplifier control circuit 100's output stage 106.

Given the aforementioned limitations of the conventional quiescent current (Iq) amplifier control circuit 100, an improved control scheme of both the quiescent current (Iq) and the currents Ip and In through the transistors 108 and 110 is needed. An improved control scheme will help provide low standby power consumption, low distortion, and full current drivability in the output stage 106.

Figure 3:
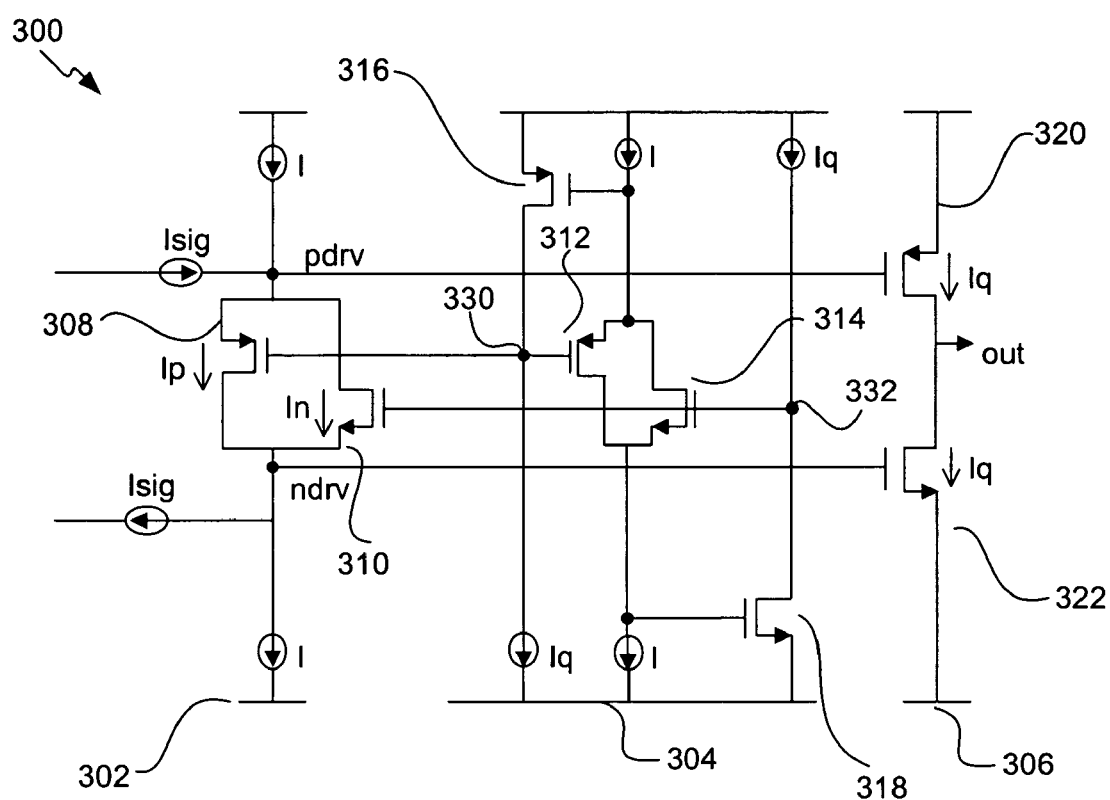
FIG. 3 is a schematic diagram of a quiescent current control circuit constructed in accordance with a first embodiment of the present invention.

FIG. 3 is a schematic diagram of a quiescent current control circuit 300 constructed in accordance with a first embodiment of the present invention. The circuit 300 in FIG. 3, however, provides a more robust technique to control the quiescent current (Iq) in output control stages.

The circuit 300 of FIG. 3 includes a driving stage 302, an Iq control stage 304, and an output stage 306. The driving stage 302 includes a pmos transistor 308 and an nmos transistor 310. The Iq control stage 304 includes a pmos transistor 312 and an nmos transistor 314. The transistor 308 is the same type as the transistor 312 and the transistor 310 is the same type as the transistor 314.

The present invention generally entails replicating portions of the driving stage and/or the output stage of amplifiers within the quiescent (Iq) control stage. By way of example, the transistors 312 and 314 of the control stage 304 are coupled together in a topology that replicates the topology of the transistors 308 and 310 of the driving stage 302.

The Iq control stage also includes a pmos transistor 316 and an nmos transistor 318 and the output stage 306 includes a pmos transistor 320 and an nmos transistor 322. The transistor 316 is the same type as the transistor 320 and the transistor 318 is the same type as the transistor 322. Also of note in the circuit 300, are connection nodes 330 and 322 (discussed in greater detail below).

In FIG. 3, the transistors 308 and 310 are connected together in a manner that mirrors the topology of the connection between the transistors 312 and 314. More specifically, sources of the transistors 308 and 312 are respectively connected to drains of the transistors 310 and 314. Also, drains of the transistors 308 and 312 are respectively connected to sources of the transistors 310 and 314. This arrangement enables more precise control of sum of the current Ip (flowing through the transistors 308 and 312) and the current In (flowing through the transistors 310 and 314).

Similarly, the transistor 316 of the control stage 304 is the same type as the transistor 320 of the output stage 306, and the transistor 318 is the same type as the transistor 322. Current flowing through the transistors 316 and 318 can be maintained at a value of Iq, based in part also on the two current sources Iq being respectively coupled to drains of the transistors 316 and 318.

An objective of the circuit 300 is that the transistors 316 and 318 be driven under the same conditions as the transistors 320 and 322, respectively. Therefore, the gate to source voltage (Vgs) of the transistor 316 is desirably the same as the Vgs of the transistor 320. Also, the Vgs of the transistor 318 is desirably the same as the Vgs of transistor 322. If the Vgs of these transistors is matched, the current flowing through the output stage transistors 320 and 322 will be Iq, which is equivalent to the current value flowing through the transistors 316 and 318, respectively.

Thus, the circuit 300 of FIG. 3 uses several interdependent techniques to control the Iq of its control stage 306. First, the circuit 300 uses type and topology matching between the transistors 312/314 of the control stage 304 and the transistors 308/310 of the driving stage 302. The circuit 300 also uses type matching between the transistors 316/318 and the transistors 320/322, respectively. Next, the current Iq flowing through the transistors 312/314 in the control stage 304 is arranged to influence the Vgs through the transistors 316/318, also in the control stage 304. And finally, the current sources Iq and produces the current value Iq flowing through the transistors 316 and 318. These techniques are cooperatively used to help maintain the value of the current flowing though the transistors 320 and 322 at Iq.

Figure 4:
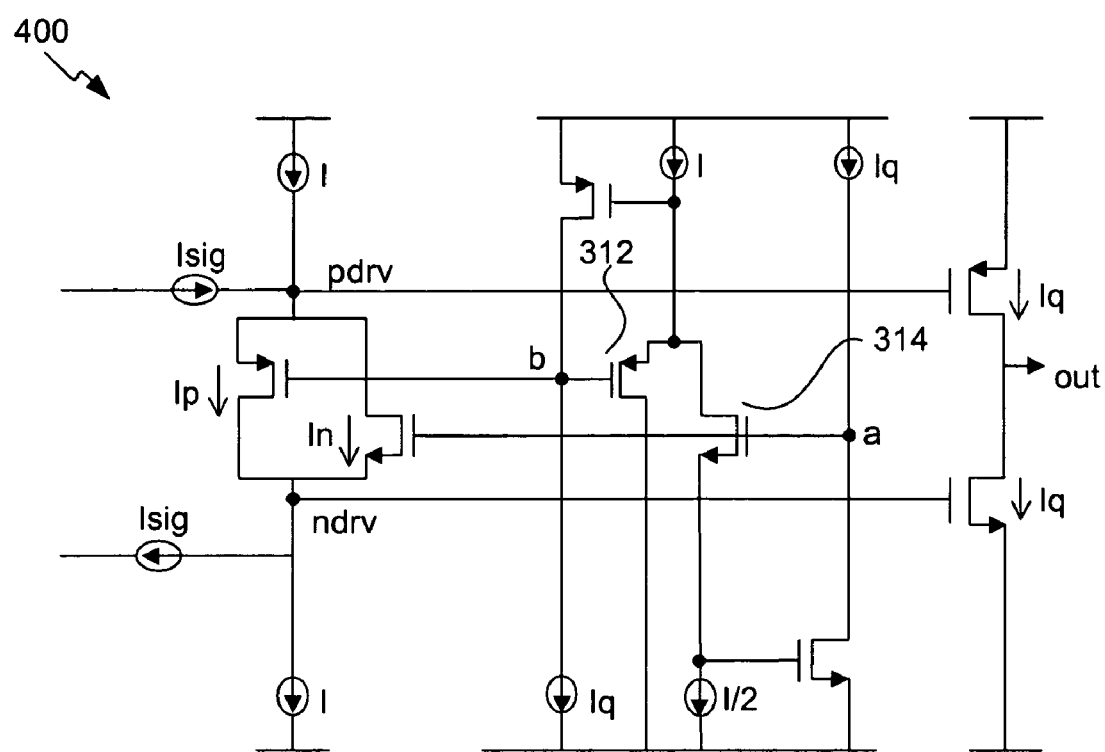
FIG. 4 is a schematic diagram of a quiescent current control circuit constructed in accordance with a second embodiment of the present invention.

FIG. 4 is a schematic diagram of a quiescent current control circuit 400 constructed in accordance with a second embodiment of the present invention. The circuit 400 is substantially similar in structure and operation to the circuit 300 of FIG. 3 with one significant exception. In the circuit 400 of FIG. 4, the drain of the transistor 312 and the source of the transistor 314 are not connected together as they are in the circuit 300.

In the circuit 300 of FIG. 3, since the transistors 312 and 314 are coupled together, the currents flowing through each of the transistors 312 and 314 can only be controlled together, as a current sum. The currents cannot be controlled individually. In the circuit 400 of FIG. 4, however, the uncoupling of the drain and the source of the transistors 312 and 314 respectively, facilitates individual current control.

That is, the current flowing through the transistors 312 and 314 can be controlled independently, and not as the current sum, as done in the circuit 300. Consequently, the current value flowing through the transistor 312 is I/2 and the current value flowing through the transistor 314 is I/2. This can make gm's of 312 and 314 same and solve the problem of low impedance of pdrv and ndrv mentioned before.

Figure 5:
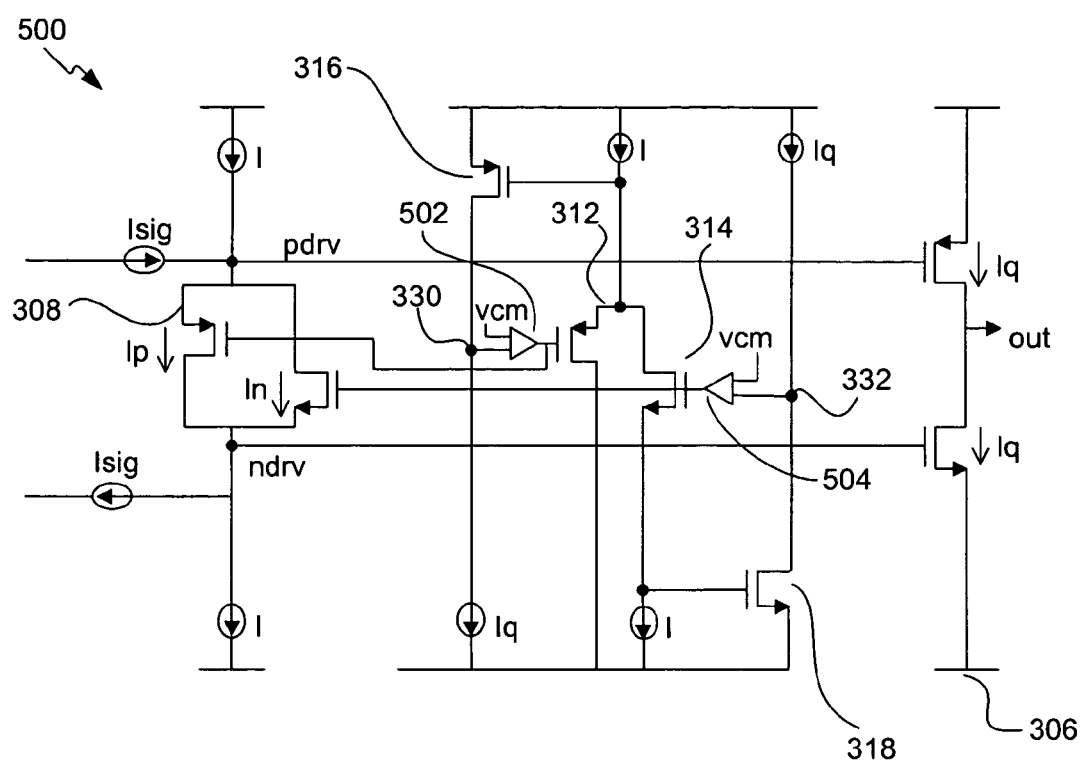
FIG. 5 is a schematic diagram of a quiescent current control circuit constructed in accordance with a third embodiment of the present invention.

FIG. 5 is a schematic diagram of a quiescent current control circuit 500 constructed in accordance with a third embodiment of the present invention. The circuit 500 of FIG. 5 is substantially similar in structure and operation to the circuit 400 of FIG. 4. The circuit 500, however, includes amplifiers 502 and 504 connected to the gates of the transistors 312 and 314 respectively.

As noted above with regard to FIG. 3, an objective of the circuit 300 is that the transistors 316 and 318 be driven under the same conditions as the transistors 318 and 322, respectively. Therefore, the Vgs of the transistor 316 is desirably the same as the Vgs of the transistor 320. Also, the Vgs of the transistor 318 is desirably the same as the Vgs of transistor 322. Although this symmetry in transistor driving conditions is desirable, in reality the driving conditions of the transistors 316/318 will not always match the driving conditions of the transistors 318/320.

For example, although the Vgs of the transistor 316 may be the same as the Vgs of the transistor 320, there can be any differences in the drain to source voltage (Vds). Under ideal conditions, when there is no input signal (Isig), meaning that the output stage 306 is driving zero current and only the current Iq is flowing, if the voltages at the node 330 and 332 can be forced the same as the voltage flowing out of the output stage 306, it gives more perfect matching and controllability of Iq. However, the voltages at the node 330, the node 332, and the voltage output from the output stage 306 can not be matched. Therefore, even in light of the transistor and topology matching techniques used in the circuits 300 and 400, variations in the output stage Iq can still occur because of these differences in Vds.

The circuit 500 of FIG. 5, therefore, includes the amplifiers 502 and 504 to minimize the differences between the voltages at the nodes 330 and 332, and the voltage output from the output stage 306. More specifically, the amplifiers 502 and 504 are provided to enable the voltage at the nodes 330 and 332 to match the output voltage (i.e., match to Vgs) when the input signal Isig is not present.

In the circuit 500 of FIG. 5, therefore, the amplifiers 502 and 504 are provided to obviate the effects of any drain to source voltage (Vds) variations between the nodes 330 and 332 and the voltage of the output stage 306. The amplifier 502 has a first input terminal connected to a common mode (cm) voltage source (not shown) and a second input terminal connected to the node 330. The amplifier 502 also has an output terminal connected to a gate of the pmos transistor 312.

Similarly, the amplifier 504 has a first input terminal connected to the common mode voltage source and a second input terminal connected to the node 332. An output terminal of the amplifier 332 is connected to a gate of the nmos transistor 504. In the circuit 500, the amplifiers 502 and 504 help to minimize the variations between the Vds voltages at the nodes 330 and 332, and the voltage output from the output stage 306. By minimizing these variations, greater control of the quiescent current (Iq) in the output stage 306 can be achieved.

Simple one-stage simple amplifiers are sufficient for the amplifiers 502 and 504. In most applications, the amplifiers 502 and 504 will not be required. However, a decision on whether to use amplifiers can be based, for example, upon the complexity of the circuits shown in FIGS. 3 and 4. This decision can also be based upon any underlying requirements for quiescent current (Iq) accuracy.

Figure 6:
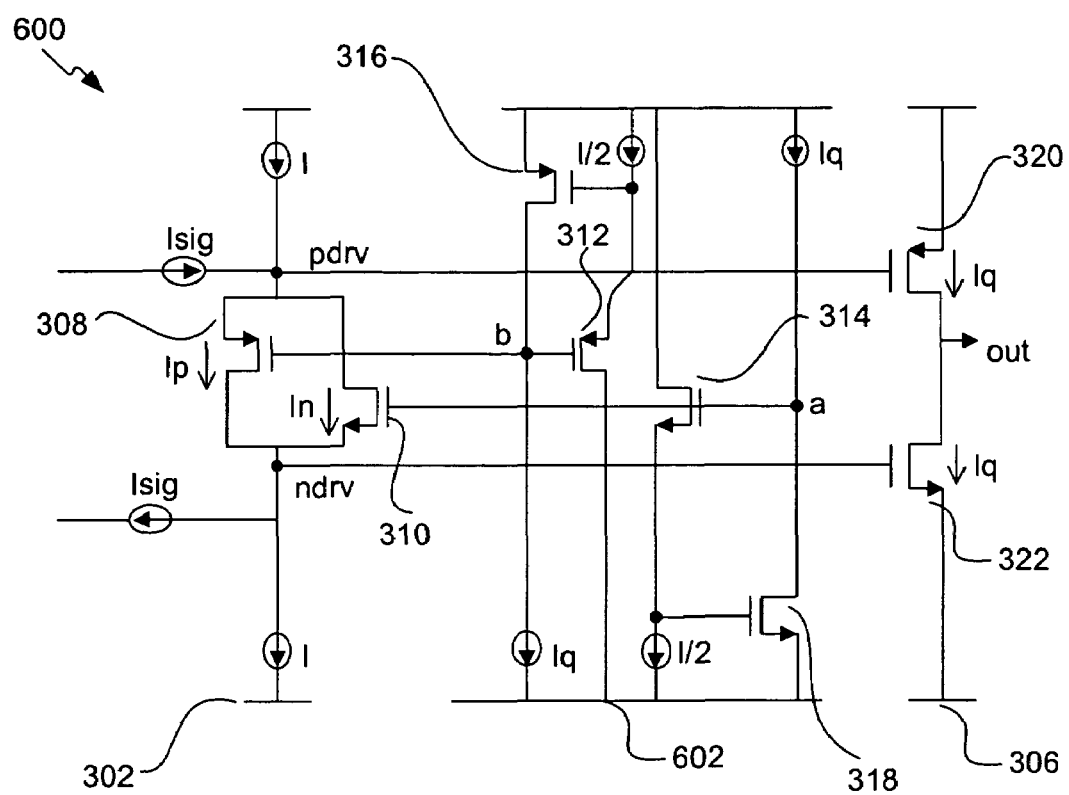
FIG. 6 is a schematic diagram of a quiescent current control circuit constructed in accordance with a fourth embodiment of the present invention.

FIG. 6 is a schematic diagram of a quiescent current control circuit constructed in accordance with a fourth embodiment of the present invention. The circuit 600 of FIG. 6 can also be used for quiescent current (Iq) control but has slightly higher control error than the circuit 300 of FIG. 3. Use of the circuit 600 can be used based upon broader goals and requirements for Iq variations.

As noted above, the present invention generally entails replicating portions of the driving stage and/or the output stage of amplifiers within the quiescent (Iq) control stage. For example, in FIG. 3, the topology and characteristics of the transistors 308 and 310 are replicated through the coupling of the transistors 312 and 314 respectively, and their characteristics. The circuit 600 provides an alternative replications scheme.

FIG. 6 includes an Iq control stage 602 that replicates, in various ways, portions of the driving stage 302 and the output stage 306, illustrated in the previous figures. In the control circuit 600, the coupling (gate to source) of the transistors 320 and 308 is replicated through gate to source coupling of the transistors 316 and 312. Similarly, the gate to source coupling of the transistors 322 and 310 is replicated through the coupling of the transistors 318 and 314.

CONCLUSION

As noted above, simulations over process, temperature, and supply voltage variation show as much as +/−26% in quiescent current (Iq) variation for the conventional Iq control circuit 100 of FIG. 1. These variations can be reduced to about +/−8% for the embodiments of the present invention, shown in FIGS. 3 and 4. The embodiment of the present invention shown in FIG. 5 further reduces Iq variations that are caused by drain to source voltage (Vds) differences (and other mismatches) between the transistors 320 and 316, and the transistors 322 and 318. In fact, simulations have shown that the circuit 500 can further reduce the quiescent current (Iq) variations to about +1-1.5%.

Another advantage of the present invention is that it separates the current control of the output stage from that of the driving stage in amplifiers. All current sources in the conventional circuit 100 of FIG. 1 need to be matched to the output stage quiescent current Iq. However, in the circuit 300 of FIG. 3, for example, the matching requirement for the driving stage 302 and output stage 306 are independent of each other, giving more flexibility for the quiescent current (Iq) control.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

What is claimed is:

1. An amplifier, comprising:
   a driving stage including first pmos and nmos transistors coupled together;
   an output stage connected to the driving stage and including second pmos and nmos transistors coupled together; and
   a quiescent current control stage connected to the driving stage and including third pmos and nmos transistors coupled together and a fourth pmos and nmos transistors coupled together;
   wherein a topology of the coupled third pmos and nmos transistors substantially matches a topology of the coupled first pmos and nmos transistors; and
   wherein gates of the second pmos and nmos transistors are respectively coupled to sources of the first pmos and nmos transistors; and
   wherein (i) a source of the third pmos is connected to a drain of the third nmos, (ii) a drain of the fourth pmos is connected to a gate of the third pmos, (iii) a gate of the fourth pmos is connected to a source of the third pmos and to a drain of the third nmos, (iv) a drain of the fourth nmos is directly connected to a gate of the first nmos, and (v) a gate of the fourth nmos is connected to a source of the third nmos.

2. The amplifier of claim 1, wherein a source of the first pmos is connected to a drain of the first nmos and a source of the first nmos is connected to a drain of the first pmos.

3. An amplifier, comprising:
   a driving stage including first pmos and nmos transistors, a source and a drain of the first pmos being respectively connected to a drain and a source of the first nmos; and
   a current control stage connected to the driving stage and having at least a first portion including second pmos and nmos transistors;
   wherein a source of the second pmos is coupled to a drain of the second nmos, gates of the second pmos and the first pmos are coupled together, and gates of the second nmos and the first nmos are coupled together; and
   wherein a drain of the second pmos is directly connected to a first common node, a source of the second nmos is coupled to a first side of a current source, and a second side of the current source is coupled to the first common node.

4. The amplifier of claim 3, further comprising:

a second portion including third pmos and nmos transistors, a gate of the third pmos being coupled the source of second pmos, and a gate of the third nmos being coupled to the source of the second nmos;

wherein a source of the third pmos is coupled to a second common node and a drain of the third nmos being coupled, at least indirectly, to the second common node; and an output stage including fourth pmos and nmos transistors, the fourth pmos and nmos transistors having drains thereof coupled together, a gate of the fourth pmos is coupled to the source of the first pmos, and a gate of the fourth nmos is coupled to a source of the first nmos.

5. The amplifier of claim 4, further comprising:
a first operational amplifier coupled to the third pmos; and
a second operational amplifier coupled to the third nmos.

6. The amplifier of claim 4, further comprising:
a first amplifier having a first input port coupled to a common-mode voltage source, a second input port coupled to a drain of the third pmos, and an output port coupled to the gate of second pmos; and
a second amplifier having a first input port coupled to the common-mode voltage source, a second input port coupled to the drain of the third nmos, and an output port coupled to the gate of the second nmos.

7. The amplifier of claim 4, further comprising an operational amplifier coupled to at least one of the third pmos and the third nmos transistors.

* * * * *